United States Patent

Noll et al.

[11] Patent Number: 6,069,498
[45] Date of Patent: May 30, 2000

[54] CLOCK GENERATOR FOR CMOS CIRCUITS WITH DYNAMIC REGISTERS

[75] Inventors: Tobias Noll, Aachen; Stefan Meier, München; Matthias Schöbinger, München; Erik De Man, München, all of Germany

[73] Assignee: Siemens Aktiengesellschaft, Munich, Germany

[21] Appl. No.: 08/945,725

[22] PCT Filed: May 7, 1996

[86] PCT No.: PCT/DE96/00794

§ 371 Date: Nov. 5, 1997

§ 102(e) Date: Nov. 5, 1997

[87] PCT Pub. No.: WO96/36113

PCT Pub. Date: Nov. 14, 1996

[30] Foreign Application Priority Data

May 11, 1995 [DE] Germany .......................... 195 17 354

[51] Int. Cl.[7] ........................................... H03K 9/06
[52] U.S. Cl. ........................... 327/49; 327/200; 327/202; 327/203; 327/210
[58] Field of Search ...................................... 327/200, 331, 327/199, 49, 47, 202, 298, 203, 210, 46, 291, 299

[56] References Cited

U.S. PATENT DOCUMENTS

| | | |
|---|---|---|
| 3,510,784 | 5/1970 | Weber .................................... 327/200 |
| 4,322,580 | 3/1982 | Khan ........................................ 379/379 |
| 4,360,782 | 11/1982 | Nowell ..................................... 327/49 |
| 4,506,165 | 3/1985 | Gulati et al. ............................ 327/217 |
| 4,633,097 | 12/1986 | Dewitt ...................................... 327/20 |
| 4,653,054 | 3/1987 | Liu ............................................ 371/61 |
| 5,041,742 | 8/1991 | Carbonaro ............................... 327/203 |
| 5,101,117 | 3/1992 | Johnson ................................... 327/149 |
| 5,703,513 | 12/1997 | Hashizume et al. .................... 327/202 |

*Primary Examiner*—Timothy P. Callahan
*Assistant Examiner*—Cassandra Cox
*Attorney, Agent, or Firm*—Hill & Simpson

[57] ABSTRACT

An apparatus has a clock monitoring device, which determines whether or not the clock rate of an input clock signal ($\Phi_o$) has fallen below a predetermined minimum clock rate. A system is provided which, from the input clock signal, forms a master clock signal ($\Phi_m$) and a slave clock signal ($\Phi_s$) which are in a form such that both the switches (S1) of dynamic master registers (ML) and the switches (S2) of dynamic slave registers (SL) are closed provided that the clock rate has fallen below the minimum clock rate. Otherwise, at most either the switches (S1) of the dynamic master latches (ML) or the switches (S2) of the dynamic slave latches (SL) are closed. The primary advantage achieved hereby is that in the event of failure of the input clock signal, in particular in circuits with a high degree of pipelining, undefined register states do not result in an impermissibly high current consumption.

8 Claims, 2 Drawing Sheets

CLOCK GENERATOR FOR CMOS CIRCUITS WITH DYNAMIC REGISTERS

BACKGROUND OF THE INVENTION

In digital integrated circuits for high throughput rates, the so-called pipelining principle is frequently employed in order to achieve the necessary processing speed. For this purpose, pipeline registers are inserted as buffers in the data path. These pipeline registers can be realized efficiently as dynamic holding elements (latches) distributed over the data path. A holding element of this type contains a clocked switch and a storage capacitance, the parasitic input capacitance of a respective downstream logic block being utilized as the storage capacitance. Suitable clock signals control the holding elements or the switches and hence the timing of the data flow in the data path. The holding elements operate according to the master/slave principle, the so-called master latches being activated for about half a clock period and the so-called slave latches being inhibited and, during the next half of a clock period, the slave latches being activated and the master latches being inhibited. When the latches are inhibited, the logic state at the input of the downstream logic block remains dynamically stored in the form of an electric charge on the parasitic input capacitance. The time for which this charge remains stored is restricted typically to about one millisecond on account of leakage currents. This is unimportant during normal operation, when the clock signals have a switching frequency of the order of magnitude of several megahertz.

If the clock signal is absent for some reason, for example if the generator in the system fails or starts only after a delay when the system is switched on, then either all the switches of the master latches or all the switches of the slave latches are inhibited and remain in this state. The logic state on this storage node is undefined, for example, at the latest after about 1 millisecond. These nodes are at a potential which is determined only by parasitic resistances and leakage currents. Given typical dimensioning of the transistors in the latches, the voltage at this node will be between 1 volt and 4 volts. Since the inputs of the downstream CMOS gates are not, in this case, at a defined CMOS level, of 5 and 0 volts, for example, it is possible for a parallel-path current to flow in these gates. Although the parallel-path current lies in the microampere range in a single CMOS gate, the number of undefined nodes can become very large in a circuit with a high degree of pipelining, with the result that the total current consumption may lie in the ampere range in the event of failure of the clock signal.

SUMMARY OF THE INVENTION

The object on which the invention is based consists, then, in specifying an apparatus for clock signal generation for CMOS circuits with dynamic registers in which, in the case of excessively low clock rates or in the case of the complete absence of a clock signal, the total current consumption is virtually unincreased in comparison with normal operation with an applied, specification-conforming clock signal.

In general terms the present invention is an apparatus for clock signal generation. A clock monitoring device is provided, which determines whether or not the clock rate of an input clock signal has fallen below a predetermined minimum clock rate. Devices are provided which, from an input clock signal, form a master clock signal and a slave clock signal which are in a form such that both the switches of dynamic master latches and the switches of dynamic slave lathes are closed provided that the clock rate has fallen below the minimum clock rate. Otherwise at most either the switches of the dynamic master latches or the switches of the dynamic slave latches are closed.

Advantageous developments of the present invention are as follows.

A first clock signal and a second clock signal which is the inverse of said first clock signal are formed from the input clock signal. In a first logic circuit, the first clock signal is ANDed with the inverted slave clock signal and subsequently NORed with a set signal to form the inverted master clock signal. In a second logic circuit, the second clock signal is ANDed with the inverted master clock signal and subsequently NORed with the set signal to form the inverted slave clock signal. A clock monitoring device is provided, which sets the set signal equal to logic 1 if the clock rate of the input clock signal has fallen below a minimum clock rate.

The clock monitoring device is constructed with first and second n-channel MOS field-effect transistors, a first and second p-channel MOS field-effect transistors, a first capacitance and a second capacitance as well as an OR circuit. The first n-channel MOS field-effect transistor and the first p-channel MOS field-effect transistor are connected in series via a first junction point. The series circuit is connected to reference-ground potential and a supply voltage. The second n-channel MOS field-effect transistor and the second p-channel MOS field-effect transistor are connected in series via a second junction point. The series circuit is connected to reference-ground potential and a supply voltage. The first junction point is connected directly to the gate terminal of the first p-channel MOS field-effect transistor directly to a first input of the OR circuit and, via the first capacitance, to reference-ground potential. The second junction point is connected directly to the gate terminal of the second p-channel MOS field-effect transistor, directly to a second input of the OR circuit and, via the second capacitance, to reference-ground potential. The first clock signal is present at the gate terminal of the further first n-channel MOS field-effect transistor. The second clock signal is present at the gate terminal of the further second n-channel MOS field-effect transistor. The set signal is present at the output of the OR circuit.

The first capacitance is formed by a third n-channel MOS field-effect transistor and the second capacitance is formed by a fourth n-channel MOS field-effect transistor.

The clock monitoring device has a ring oscillator, a first counter/decoder unit, a second counter/decoder unit and a flip-flop. A counter input of the first counter/decoding unit is connected to an output of the ring oscillator, a reset input of the first counter/decoding unit is connected to a line for the first clock signal, and an output of the first counter/decoding unit is connected to a set input of the RS flip-flop. The ratio of the clock rate of the ring oscillator to the minimum clock rate of the input clock signal is defined in the first counter/decoding unit. A counter input of the second counter/decoding unit is connected to the line for the first clock signal. A resent input of the second counter/decoding unit is connected to the output of the first counter/decoding unit. An output of the second counter/decoding unit connected to a reset input of the RS flip-flop. The number of clock pulses, at a clock rate which is greater than or equal to the minimum clock rate of the input clock signal, that are counted before the flip-flop is reset, is defined in the second counter/decoding unit. The set signal is present at the output of the flip-flop.

The first logic circuit is in each case constructed with first, second and third n-channel MOS field-effect transistors and first, second and third p-channel MOS field-effect transistors. The first n-channel MOS field-effect transistor, the second n-channel MOS field-effect transistor, the first p-channel MOS field-effect transistor and the third p-channel MOS field-effect transistor are connected in series. The series circuit is connected to reference-ground potential and a supply voltage. The third n-channel MOS field-effect transistor, the second p-channel MOS field-effect transistor and the third p-channel MOS field-effect transistor is connected in series. The series circuit being connected to reference-ground potential and a supply voltage. A junction point between the second n-channel MOS field-effect transistor and the first p-channel MOS field-effect transistor is connected to a junction point between the third n-channel MOS field-effect transistor and the second p-channel MOS field-effect transistor and supplies the inverted slave clock signal. The gate terminal of the first n-channel MOS field-effect transistor and the gate terminal of the second p-channel MOS field-effect transistor are supplied with the second clock signal. The gate terminal of the second n-channel MOS field-effect transistor and the gate terminal of the first n-channel MOS field-effect transistor are supplied with the inverted master clock signal. The gate terminal of the third p-channel MOS field-effect transistor is supplied with the set signal. The width of the third p-channel MOS field-effect transistor is greater by at least one order of magnitude than the widths of the first p-channel MOS field-effect transistor and of the second p-channel MOS field-effect transistor. The width of the third n-channel MOS field-effect transistor is smaller by at least one order of magnitude than the widths of the first n-channel MOS field-effect transistor and of the second n-channel MOS field-effect transistor.

The second logic circuit is in each case constructed with first, second and third n-channel MOS field-effect transistors and first, second and third p-channel MOS field-effect transistors. The first n-channel MOS field-effect transistor, the second n-channel MOS field-effect transistor, the first p-channel MOS field-effect transistor and the third p-channel MOS field-effect transistor are connected in series. The series circuit is connected to reference-ground potential and a supply voltage. The third n-channel MOS field-effect transistor, the second p-channel MOS field-effect transistor and the third p-channel MOS field-effect transistor are connected in series. The series circuit is connected to reference-ground potential and a supply voltage. A junction point between the second n-channel MOS field-effect transistor and the first p-channel MOS field-effect transistor is connected to a junction point between the third n-channel MOS field-effect transistor and the second p-channel MOS field-effect transistor and supplies the inverted master clock signal. The gate terminal of the first n-channel MOS field-effect transistor and the gate terminal of the second p-channel MOS field-effect transistor are supplied with the first clock signal. The gate terminal of the second n-channel MOS field-effect transistor and the gate terminal of the first n-channel MOS field-effect transistor are supplied with the inverted slave clock signal. The gate terminal of the third p-channel MOS field-effect transistor is supplied with the set signal.

The width of the third p-channel MOS field-effect transistor is greater by at least one order to magnitude than the widths of the first p-channel MOS field-effect transistor and of the second p-channel MOS field-effect transistor. The width of the third n-channel MOS field-effect transistor being smaller by at least one order of magnitude than the widths of the first n-channel MOS field-effect transistor and of the second n-channel MOS field-effect transistor.

The master clock signal and the slave clock signal are in a firm such that, independently of the clock rate, both the switches of the dynamic master latches and the switches of the dynamic slave latches are closed provided that an apparatus is selected by a block switch-off signal. Otherwise at most either the switches of the dynamic master latches or the switches of the dynamic slave latches are closed.

What is advantageous here is that the CMOS circuit is not heated in an impermissible manner or overloading of a voltage supply connected to the CMOS circuit does not occur. A further advantage consists in the fact that, during production monitoring, checking of the leakage currents can be carried out in a manner significantly freer from interference.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
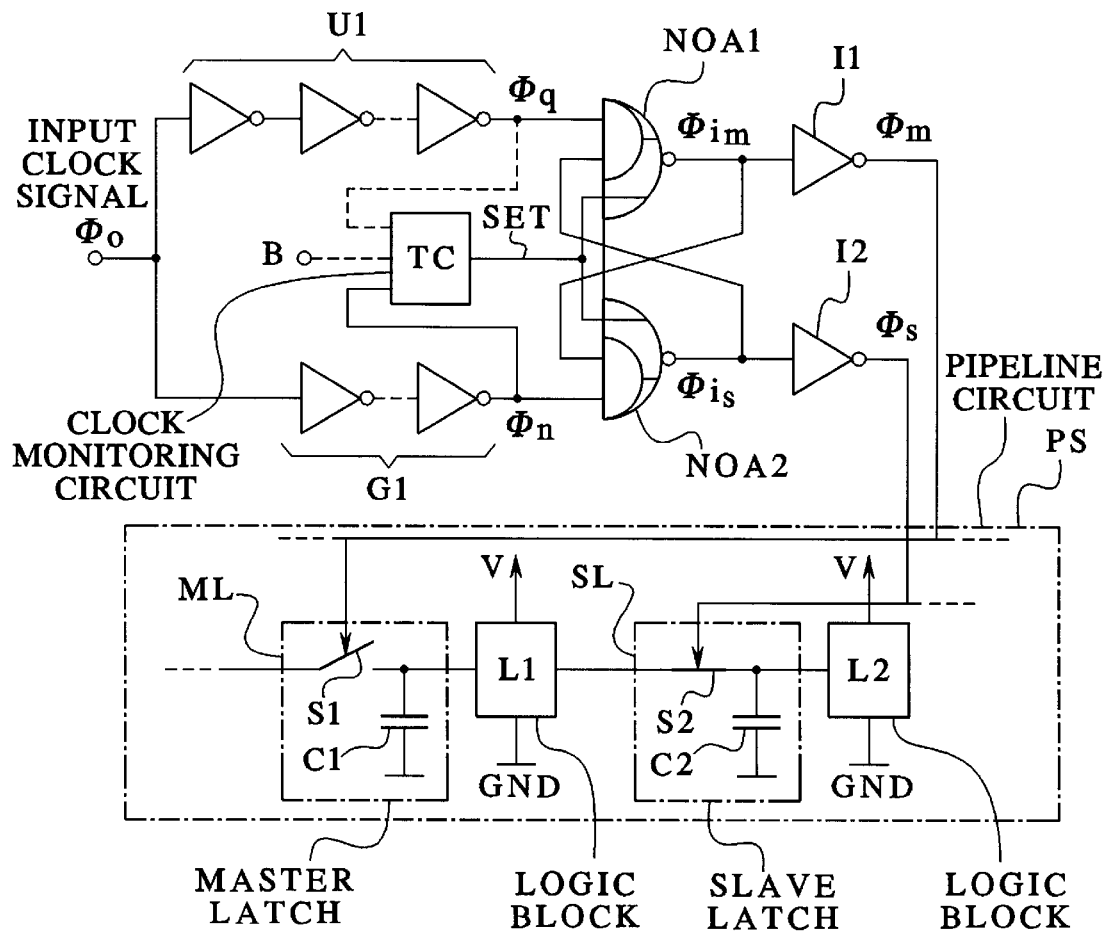
FIG. 1 shows a circuit diagram of the inventive apparatus for clock signal generation together with two pipeline stages.

FIG. 1 illustrates an inventive apparatus for clock signal generation together with a pipeline circuit PS, the circuit PS having a logic block L1 with an upstream master latch ML as well as a second logic block L2 which is connected via a slave latch SL to the first logic block L1. The master latch ML in this case comprises a switch S1, which is driven by a master clock signal $\Phi_m$, and a parasitic input capacitance C1 of the logic block L1 as storage capacitance. The slave latch SL comprises a switch S2, which is driven by a slave clock signal $\Phi_s$, and a parasitic input capacitance C2 of the logic block L2. The logic blocks L1 and L2 are connected to a supply voltage VDD and reference-ground potential GND.

The master clock signal $\Phi_m$ and the slave clock signal $\Phi_s$ are formed in an inventive apparatus for clock signal generation which comprises, for example, a series of invertors UI, GI, I1 and I2, two logic circuits NOA1 and NOA2 as well as a clock monitoring circuit TC.

A clock signal $\Phi_q$ is formed, for example with the aid of an odd number of invertors UI, by inversion of the input clock signal $\Phi_0$ and a clock signal $\Phi_n$ is formed, for example directly or with the aid of an even number of inventors GI, without inversion from the input clock signal $\Phi_0$. A set signal SET is formed from the two clock signals $\Phi_q$ and $\Phi_n$ with the aid of the clock monitoring device TC, a further embodiment of the clock monitoring unit TC which requires only the clock signal $\Phi_n$ and no clock signal $\Phi_q$ being indicated by dashed lines in FIG. 1.

Finally, another embodiment is indicated by dashed lines in FIG. 1 in which, in the clock monitoring unit TC, the set signal SET can also additionally be set as a function of an external block switch-off signal B in such a way that the switches S1 and S2 of the pipeline circuit PS are closed. This embodiment is conceived of for the case where a plurality of blocks each having an inventive apparatus for clock signal generation and each having an associated pipeline circuit are present.

The logic circuits NOA1 and NOA2 each comprise a two-input AND gate, whose output is logically combined, via a two-input NOR gate, with a third input to form the output signal of the logic circuit. One input of the AND gate in this case receives the clock signal $\Phi_q$ and the other input of the AND gate receives an inverted slave clock signal $\Phi i_s$ at the output of the logic circuit NOA2, and the NOR input of the logic circuit NOA1 is connected to the output of the clock monitoring unit and receives the signal SET. Correspondingly, a first input of the AND gate of the logic circuit NOA2 receives the clock signal $\Phi_n$ and the second input of the AND gate receives the fed-back clock signal $\Phi i_m$ and the NOR input of the logic circuit NOA2 receives the set signal SET. In this example, the master clock signal $\Phi_m$ is formed by an invertor I1 from the inverted master clock signal $\Phi_m$ and the slave clock signal $\Phi_s$ is formed by the inverter I2 from the inverted slave clock signal $\Phi i_s$. The invertors I1 and I2 can also be dispensed with, if appropriate, depending on the type of switches S1 and S2.

During normal operation, in other words given a specification-conforming input clock signal $\Phi_0$, the apparatus for clock signal generation prevents the switches S1 and S2 from being simultaneously closed. In the case of an input clock signal $\Phi_0$ which has a clock rate which is less than a predetermined minimum clock rate, the clock monitoring device TC generates a signal SET=logic one, which effects, by means of the two logic circuits NOA1 and NOA2 together with the invertors I1 and I2, a master clock signal $\Phi_s$=logic one and a slave clock signal $\Phi_s$=logic one, as a result of which the switches S1 and S2 are closed and defined potential ratios are set at the inputs of the logic blocks L1 and L2 and, consequently, parallel-path currents in the logic blocks L1 and L2 are prevented in this case too.

Figure 2:
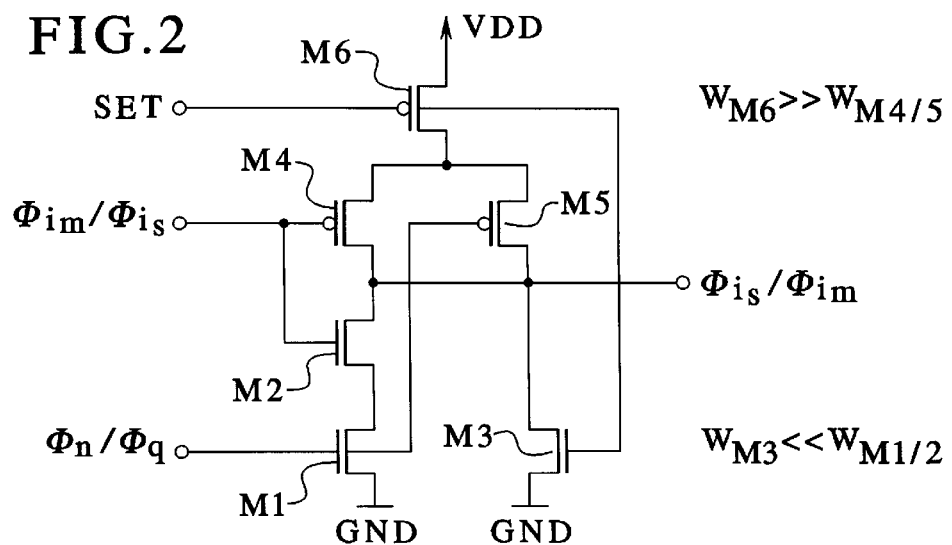
FIG. 2 shows an advantageous embodiment of the logic circuits of FIG. 1.

FIG. 2 shows an advantageous configuration of the logic circuit NOA1 and/or NOA2, which comprises three n-channel MOS field-effect transistors M1 ... M3 and three p-channel MOS field-effect transistors M4 ... M6. The field-effect transistors M1, M2, M4 and M6 are in this case connected in series and the series circuit is connected between reference-ground potential and a supply voltage VDD. Furthermore, the field-effect transistors M3, M5 and M6 are connected in series and this series circuit is likewise connected between reference-ground potential GND and the supply voltage VDD. The gate terminals of the transistors M2 and M4 are supplied with the clock signal $\Phi i_m$ in the case of the logic circuit NOA2 and with the clock signal $\Phi i_s$ in the case of the logic circuit NOA1. The field-effect transistors M1 and M5 are supplied with the clock signal $\Phi_n$ in the case of the logic circuit NOA2 and with the clock signal $\Phi_q$ in the case of the logic circuit NOA1. A connection node between the field-effect transistor M2 and the field-effect transistor M4 is connected to a connection node between the field-effect transistors M3 and M5 and carries the clock signal $\Phi i_s$ in the case of the logic circuit NOA2 and the clock signal $\Phi i_m$ in the case of the logic circuit NOA1. The gate terminals of the field-effect transistors M6 and M3 are supplied with the set signal SET. The field-effect transistor M6 is in the on state during normal operation and its transistor width $W_{M6}$ should preferably be dimensioned to be at least one order of magnitude greater than the widths $W_{M4/5}$ of the field-effect transistors M4 and M5 in order that the channel resistance of the transistor M6 is small in comparison with the switched-on transistors M4 and M5. Furthermore, the width WM3 should preferably be selected to be at least one order of magnitude smaller than the widths $W_{M1/2}$ of the transistors M1 and M2 in order that the parasitic diffusion capacitance of the field-effect transistor M3 is small in comparison with the total capacitance which is already present at the output of the respective logic circuit.

Figure 3:
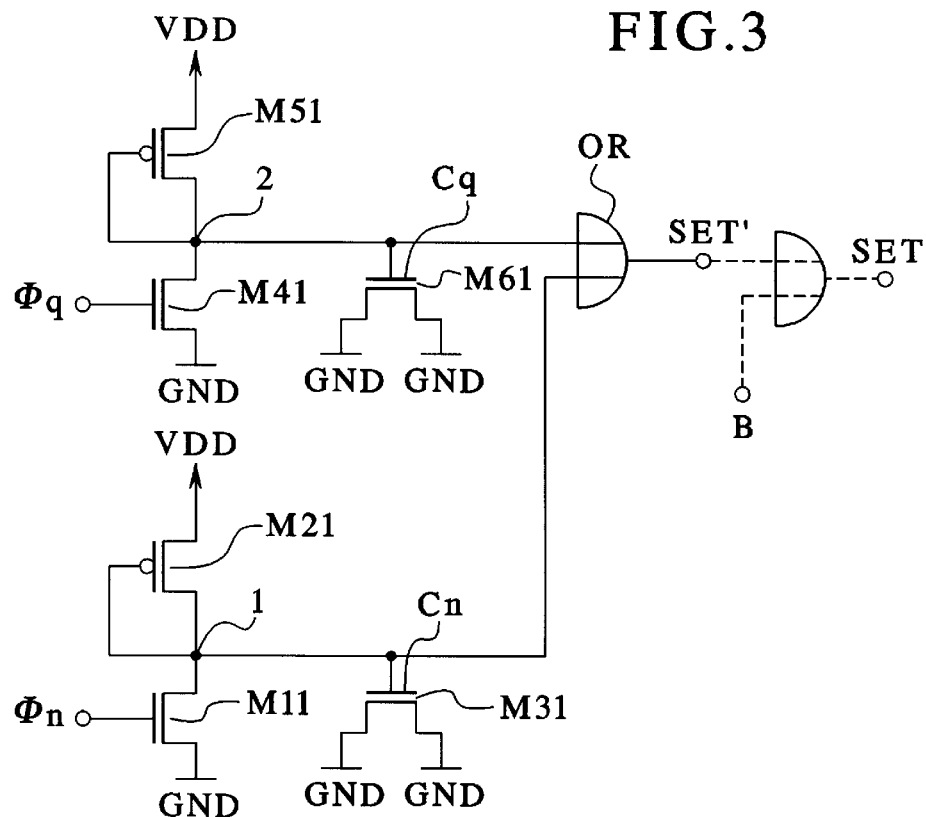
FIG. 3 shows an advantageous refinement of the clock monitoring unit of FIG. 1.

FIG. 3 illustrates an embodiment of the clock monitoring circuit TC which requires particularly little chip area. The clock monitoring unit TC in this case contains at least the n-channel transistors M11 and M41 and the p-channel MOS field-effect transistors M21 and M51, the capacitances $C_q$ and $C_n$ as well as an OR circuit OR. The capacitances $C_q$ and $C_n$ can advantageously be realized by further n-channel MOS field-effect transistors M31 and M61, the gate terminal of these transistors constituting one terminal of the respective capacitance and the source and drain terminals, which are each at reference-ground potential, constituting the other terminal of the respective capacitance. The field-effect transistors M11 and M21 are connected in series and the series circuit is connected to reference-ground potential GND and a supply voltage VDD. Correspondingly, the transistors M41 and M51 are connected in series and the series circuit is connected to reference-ground potential GND and the supply voltage VDD. The clock signal $\Phi_n$ is fed to the gate terminal of the transistor M11 and the clock signal $\Phi_q$ is fed to the gate terminal of the transistor M41. The connection node 1 between the two transistors M11 and M21 is connected to the gate terminal of the transistor M21, and is connected to an input of the OR circuit OR, the capacitance $C_n$ being effective between this input and reference-ground potential. The connection node 2 between the transistors M41 and M51 is connected to the gate terminal of the transistor M51, and is connected to a further input of the OR circuit OR, the capacitance $C_q$ being effective between the further input and reference-ground potential. A set signal SET' can be picked off at the output of the OR circuit, which set signal SET', depending on the embodiment, forms the set signal SET either directly or after having been ORed with the block switch-off signal B.

When the clock signal $\Phi_0$ is running, the clock signals $\Phi_n$ and $\Phi_q$ are likewise toggled and, in that half of the clock phase in which they are logic one, they discharge the gate capacitance of the transistors M31 and M61. In that half of the clock phase in which the clock signals $\Phi_n$ and $\Phi_q$ are logic zero, the capacitances $C_n$ and $C_q$ are charged via the pull-up transistors M21 and M51, respectively. The transistors M2 and M3 and the transistors M5 and M6 respectively form an RC element, the time constants of the RC elements defining the minimum possible clock frequency at which the circuit is still in normal operation. This time constant should lie in the range of a few microseconds. The transistors M11 and M41 must have a greater width than the transistors M21 and M51, respectively, in order to be able to reliably discharge the capacitances $C_n$ and $C_q$, respectively, which have been charged in the first half of the clock period via the transistors M21 and M51, respectively. When the clock signal is absent, either the clock signal $\Phi_n$ or $\Phi_q$ permanently has the logic value zero, with the result that either the gate of the transistor M31 or the gate of the transistor M61 can no longer be discharged. The capacitances $C_n$ or $C_q$ are charged and, after a time delay which is determined by said time constants, the set output assumes the logic value one.

Figure 4:
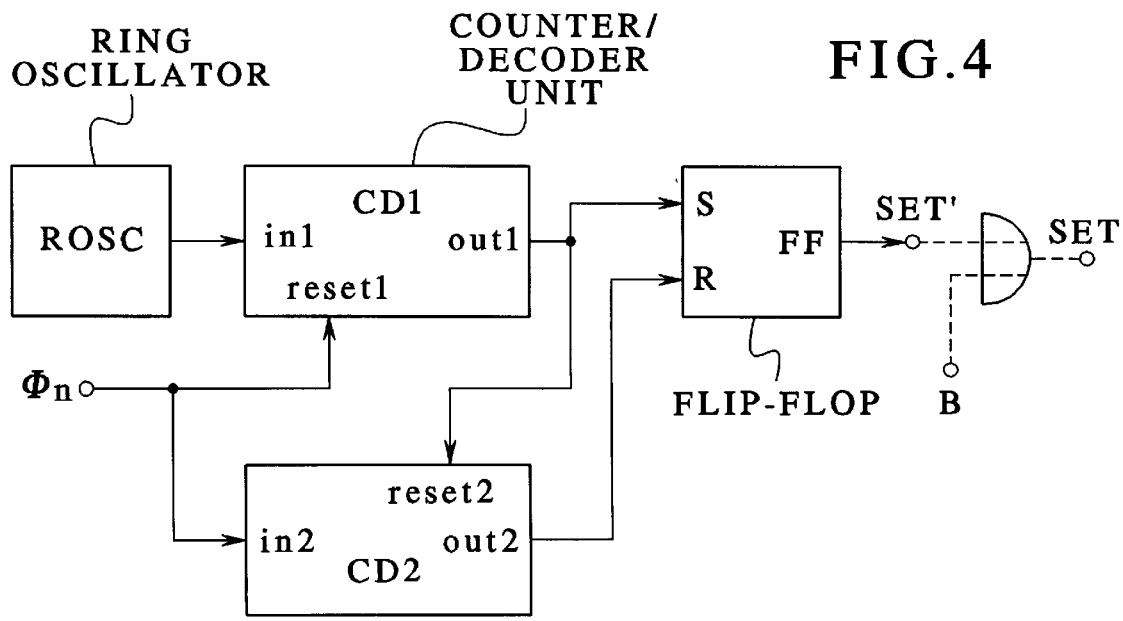
FIG. 4 shows a further advantageous refinement of the clock monitoring unit of FIG. 1.

FIG. 4 shows an alternative embodiment of the clock monitoring unit TC in the form of a digital circuit which has a ring oscillator ROSC, two counter/decoding units CD1 and CD2 and an RS flip-flop FF. The output of the ring oscillator ROSC is connected to an input in1 of the unit CD1. The clock signal $\Phi_n$ is fed to a reset input reset1 of the unit CD1 and to an input in2 of the unit CD2. The output out1 of the unit CD1 is connected to the set input S of the flip-flop FF and to a reset input reset2 of the unit CD2. The output out2 of the unit CD2 is connected to the reset input R of the flip-flop FF and the output of this flip-flop supplies the set signal SET', which, depending on the embodiment, forms the set signal SET either directly or after having been ORed with the block switch-off signal B.

The ring oscillator ROSC is free-running and generates a signal which is divided down and decoded in the counter/decoding unit CD1 such that after n respective input pulses an output pulse is generated. The reset input reset1 is edge-triggered and connected up to the clock signal $\Phi_n$, as a result of which, during normal operation, the counter is in each case reset before the counter reading n is reached. If no clock signal is present, or if only a signal with an excessively low clock rate is present, the counter reading n is reached and the output signal of the counter sets the RS flip-flop. This flip-flop is reset, via its reset input R, by the counter/decoding unit CD2 if a plurality of clock pulses have been counted without the unit CD1 having been able to count up to the reading n. The ratio between the clock frequency of the free-running ring oscillator ROSC and the minimum clock rate at which the chip is to be operated is defined in the unit CD1. The number of clock pulses at a clock rate which is greater than or equal to the minimum clock frequency which are to be counted before the set signal SET is switched off again is defined in the unit CD2. The advantages over the embodiment of FIG. 3 are that the ratio between the minimum clock rate and the clock rate of the ring oscillator can freely be defined by the number of counter stages in the unit CD1 or, if appropriate, can even have a programmable configuration. Furthermore, this configuration can be realized considerably more simply in a standard cell system than the embodiment of FIG. 3.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An apparatus for generating a clock signal comprising:
   a clock forming device that forms master clock signals and slave clock signals based on an input clock signal;
   a clock monitoring device for providing a predetermined value of a set signal to the clock forming device when the input clock signal falls below a predetermined minimum clock rate;
   at least one dynamic master latch having at least one switch configured to receive master clock signals from the clock forming device; and
   at least one dynamic slave latch having at least one switch configured to receive slave clock signals from the clock forming device;
   wherein the clock forming device provides a master clock signal and a slave clock signal that respectively close the switches of both the at least one dynamic master latch and the at least one dynamic slave latch when the clock forming device receives the predetermined value of the set signal, and at most only one of the switches of the at least one dynamic master latch and the at least one dynamic slave latch is closed when the clock forming device does not receive the predetermined value of the set signal.

2. The apparatus for clock signal generation as claimed in claim 1,
   wherein a first clock signal and a second clock signal which is an inverse of said first clock signal are formed from the input clock signal;
   wherein, in a first logic circuit, the first clock signal is ANDed with an inverted slave clock signal and subsequently NORed with the set signal to form an inverted master clock signal;
   wherein, in a second logic circuit, the second clock signal is ANDed with the inverted master clock signal and subsequently NORed with the set signal to form the inverted slave clock signal; and
   wherein the clock monitoring device sets the predetermined value of set signal equal to logic 1 if the clock rate of the input clock signal has fallen below the predetermined minimum clock rate.

3. The apparatus as claimed in claim 1, wherein the master clock signal and the slave clock signal are in a form such that, independently of the clock rate, both the at least one switch of the dynamic master latch and the at least one switch of the dynamic slave latch are closed provided that an apparatus is selected by a block switch-off signal, and otherwise at most one of the switches of the dynamic master latches and the switches of the dynamic slave latches is closed.

4. An apparatus for clock signal generation, comprising:
   a clock monitoring device for determining when a clock rate of an input clock signal has fallen below a predetermined minimum clock rate and generating a set signal;
   dynamic master latches having switches and dynamic slave latches having switches;
   a clock forming system connected to the clock monitoring device and the dynamic master and slave latches for forming, from the input clock signal, a master clock signal and a slave clock signal which are in a form such that both the switches of the dynamic master latches and the switches of the dynamic slave latches are closed provided that the clock rate has fallen below the predetermined minimum clock rate, and otherwise at most one of the switches of the dynamic master latches and the switches of the dynamic slave latches is closed;
   the clock forming system further forming a first clock signal and a second clock signal, which is an inverse of said first clock signal formed from the input clock signal and having a first logic circuit, the first clock signal being ANDed with an inverted slave clock signal and subsequently NORed with a set signal to form an inverted master clock signal and a second logic circuit, the second clock signal being ANDed with the inverted master clock signal and subsequently NORed with the set signal to form the inverted slave clock signal;
   wherein the clock monitoring device sets the set signal equal to logic 1 if the clock rate of the input clock signal has fallen below the minimum clock rate;
   the clock monitoring device having first and second n-channel MOS field-effect transistors, first and second p-channel MOS field-effect transistors, a first capacitance and a second capacitance as well as an OR circuit;
   the first n-channel MOS field-effect transistor and the first p-channel MOS field-effect transistor connected in a first series circuit via a first junction point, the first series circuit being connected to reference-ground potential and a supply voltage;

the second n-channel MOS field-effect transistor and the second p-channel MOS field-effect transistor connected in a second series circuit via a second junction point, the second series circuit being connected to reference-ground potential and a supply voltage;

the first junction point connected directly to a gate terminal of the first p-channel MOS field-effect transistor directly to a first input of the OR circuit and, via the first capacitance, to reference-ground potential;

the second junction point connected directly to a gate terminal of the second p-channel MOS field-effect transistor, directly to a second input of the OR circuit and, via the second capacitance, to reference-ground potential; and the first clock signal present at the gate terminal of the first n-channel MOS field-effect transistor, the second clock signal present at the gate terminal of the second n-channel MOS field-effect transistor, and the set signal present at the output of the OR circuit.

5. The apparatus claimed in claim 4, wherein the first capacitance is formed by a third n-channel MOS field-effect transistor and the second capacitance is formed by a fourth n-channel MOS field-effect transistor.

6. An apparatus for clock signal generation, comprising:

a clock monitoring device for determining when a clock rate of an input clock signal has fallen below a predetermined minimum clock rate and generating a set signal;

dynamic master latches having switches and dynamic slave latches having switches;

a clock forming system connected to the clock monitoring device and the dynamic master and slave latches for forming, from the input clock signal, a master clock signal and a slave clock signal which are in a form such that both the switches of the dynamic master latches and the switches of the dynamic slave latches are closed provided that the clock rate has fallen below the predetermined minimum clock rate, and otherwise at most one of the switches of the dynamic master latches and the switches of the dynamic slave latches is closed;

the clock forming system further forming a first clock signal and a second clock signal, which is an inverse of said first clock signal formed from the input clock signal and having a first logic circuit, the first clock signal being ANDed with an inverted slave clock signal and subsequently NORed with a set signal to form an inverted master clock signal and a second logic circuit, the second clock signal being ANDed with the inverted master clock signal and subsequently NORed with the set signal to form the inverted slave clock signal;

wherein the clock monitoring device sets the set signal equal to logic 1 if the clock rate of the input clock signal has fallen below the minimum clock rate;

the clock monitoring device having a ring oscillator, a first counter/decoder unit, a second counter/decoder unit and a flip-flop;

a counter input of the first counter/decoding unit connected to an output of the ring oscillator, a reset input of the first counter/decoding unit being connected to a line for the first clock signal, and an output of the first counter/decoding unit being connected to a set input of the RS flip-flop;

a ratio of the clock rate of the ring oscillator to the minimum clock rate of the input clock signal defined in the first counter/decoding unit;

a counter input of the second counter/decoding unit connected to the line for the first clock signal, a reset input of the second counter/decoding unit being connected to the output of the first counter/decoding unit, and an output of the second counter/decoding unit being connected to a reset input of the RS flip-flop;

a number of clock pulses, at a clock rate which is greater than or equal to the minimum clock rate of the input clock signal, that are counted before the flip-flop is reset, defined in the second counter/decoding unit; and the set signal present at the output of the flip-flop.

7. An apparatus for clock signal generation, comprising:

a clock monitoring device for determining when a clock rate of an input clock signal has fallen below a predetermined minimum clock rate and generating a set signal;

dynamic master latches having switches and dynamic slave latches having switches;

a clock forming system connected to the clock monitoring device and the dynamic master and slave latches for forming, from the input clock signal, a master clock signal and a slave clock signal which are in a form such that both the switches of the dynamic master latches and the switches of the dynamic slave latches are closed provided that the clock rate has fallen below the predetermined minimum clock rate, and otherwise at most one of the switches of the dynamic master latches and the switches of the dynamic slave latches is closed;

the clock forming system further forming a first clock signal and a second clock signal, which is an inverse of said first clock signal formed from the input clock signal and having a first logic circuit, the first clock signal being ANDed with an inverted slave clock signal and subsequently NORed with a set signal to form an inverted master clock signal and a second logic circuit, the second clock signal being ANDed with the inverted master clock signal and subsequently NORed with the set signal to form the inverted slave clock signal;

wherein the clock monitoring device sets the set signal equal to logic 1 if the clock rate of the input clock signal has fallen below the minimum clock rate;

the first logic circuit having first, second and third n-channel MOS field-effect transistors and first, second and third p-channel MOS field-effect transistors;

the first n-channel MOS field-effect transistor, the second n-channel MOS field-effect transistor, the first p-channel MOS field-effect transistor and the third p-channel MOS field-effect transistor connected in a first series circuit, the first series circuit being connected to reference-ground potential and a supply voltage;

the third n-channel MOS field-effect transistor, the second p-channel MOS field-effect transistor and the third p-channel MOS field-effect transistor connected in a second series circuit, the second series circuit being connected to the reference-ground potential and the supply voltage;

a junction point between the second n-channel MOS field-effect transistor and the first p-channel MOS field-effect transistor connected to a junction point between the third n-channel MOS field-effect transistor and the second p-channel MOS field-effect transistor, supplying the inverted slave clock signal;

a gate terminal of the first n-channel MOS field-effect transistor and a gate terminal of the second p-channel MOS field-effect transistor supplied with the second clock signal, the gate terminal of the second n-channel MOS field-effect transistor and the gate terminal of the first n-channel MOS field-effect transistor supplied with the inverted master clock signal, and the gate terminal of the third p-channel MOS field-effect transistor supplied with the set signal;

a width of the third p-channel MOS field-effect transistor greater by at least one order of magnitude than widths of the first p-channel MOS field-effect transistor and of the second p-channel MOS field-effect transistor; and a width of the third n-channel MOS field-effect transistor smaller by at least one order of magnitude than widths of the first n-channel MOS field-effect transistor and of the second n-channel MOS field-effect transistor.

8. An apparatus for clock signal generation, comprising:

a clock monitoring device for determining when a clock rate of an input clock signal has fallen below a predetermined minimum clock rate and generating a set signal;

dynamic master latches having switches and dynamic slave latches having switches;

a clock forming system connected to the clock monitoring device and the dynamic master and slave latches for forming, from the input clock signal, a master clock signal and a slave clock signal which are in a form such that both the switches of the dynamic master latches and the switches of the dynamic slave latches are closed provided that the clock rate has fallen below the predetermined minimum clock rate, and otherwise at most one of the switches of the dynamic master latches and the switches of the dynamic slave latches is closed;

the clock forming system further forming a first clock signal and a second clock signal, which is an inverse of said first clock signal formed from the input clock signal and having a first logic circuit, the first clock signal being ANDed with an inverted slave clock signal and subsequently NORed with a set signal to form an inverted master clock signal and a second logic circuit, the second clock signal being ANDed with the inverted master clock signal and subsequently NORed with the set signal to form the inverted slave clock signal;

wherein the clock monitoring device sets the set signal equal to logic 1 if the clock rate of the input clock signal has fallen below the minimum clock rate;

the second logic circuit having first, second and third n-channel MOS field-effect transistors and first, second and third p-channel MOS field-effect transistors;

the first n-channel MOS field-effect transistor, the second n-channel MOS field-effect transistor, the first p-channel MOS field-effect transistor and the third p-channel MOS field-effect transistor connected in a first series circuit, the first series circuit being connected to reference-ground potential and a supply voltage;

the third n-channel MOS field-effect transistor, the second p-channel MOS field effect transistor and the third p-channel MOS field-effect transistor connected in a second series and the second series circuit being connected to reference-ground potential and a supply voltage;

a junction point between the second n-channel MOS field-effect transistor and the first p-channel MOS field-effect transistor connected to a junction point between the third n-channel MOS field-effect transistor and the second p-channel MOS field-effect transistor supplying the inverted master clock signal;

a gate terminal of the first n-channel MOS field-effect transistor and a gate terminal of the second p-channel MOS field-effect transistor supplied with the first clock signal, a gate terminal of the second n-channel MOS field-effect transistor and a gate terminal of the first n-channel MOS field-effect transistor supplied with the inverted slave clock signal, and the gate terminal of the third p-channel MOS field-effect transistor supplied with the set signal;

a width of the third p-channel MOS field-effect transistor being greater by at least one order of magnitude than widths of the first p-channel MOS field-effect transistor and of the second p-channel MOS field-effect transistor; and a width of the third n-channel MOS field-effect transistor being smaller by at least one order of magnitude than widths of the first n-channel MOS field-effect transistor and of the second n-channel MOS field-effect transistor.

* * * * *